(12) United States Patent
Liou et al.

(10) Patent No.: US 8,883,638 B2
(45) Date of Patent: Nov. 11, 2014

(54) METHOD FOR MANUFACTURING DAMASCENE STRUCTURE INVOLVING DUMMY VIA HOLES

(75) Inventors: En-Chiuan Liou, Tainan (TW); Chih-Wei Yang, Kaohsiung (TW); Chih-Sen Huang, Tainan (TW); Chan-Yuan Hu, Tainan (TW); Ssu-I Fu, Kaohsiung (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 256 days.

(21) Appl. No.: 13/352,352

(22) Filed: Jan. 18, 2012

(65) Prior Publication Data
US 2013/0183825 A1 Jul. 18, 2013

(51) Int. Cl.
*H01L 21/44* (2006.01)

(52) U.S. Cl.
USPC ............ 438/675; 438/98; 438/431; 438/926; 257/E21.586

(58) Field of Classification Search
CPC .................................................. H01L 21/768
USPC ............ 438/98, 431, 926, 675; 257/E21.586
See application file for complete search history.

(56) References Cited

U.S. PATENT DOCUMENTS

| | | | | |
|---|---|---|---|---|
| 4,789,648 A * | 12/1988 | Chow et al. | ............. | 438/633 |
| 4,956,313 A * | 9/1990 | Cote et al. | ............. | 438/672 |
| 5,578,523 A * | 11/1996 | Fiordalice et al. | ............. | 438/633 |
| 5,741,626 A * | 4/1998 | Jain et al. | ............. | 430/314 |
| 5,801,094 A * | 9/1998 | Yew et al. | ............. | 438/624 |
| 5,891,799 A * | 4/1999 | Tsui | ............. | 438/624 |
| 5,920,148 A * | 7/1999 | Potter | ............. | 313/309 |
| 5,920,790 A * | 7/1999 | Wetzel et al. | ............. | 438/618 |
| 5,960,254 A * | 9/1999 | Cronin | ............. | 438/14 |
| 5,960,310 A * | 9/1999 | Jeong | ............. | 438/622 |
| 5,976,963 A * | 11/1999 | Cronin et al. | ............. | 438/597 |
| 6,001,733 A * | 12/1999 | Huang et al. | ............. | 438/633 |
| 6,001,735 A * | 12/1999 | Tsai | ............. | 438/638 |
| 6,072,227 A * | 6/2000 | Yau et al. | ............. | 257/642 |
| 6,080,652 A * | 6/2000 | Yamaha et al. | ............. | 438/622 |
| 6,083,824 A * | 7/2000 | Tsai et al. | ............. | 438/629 |
| 6,087,733 A * | 7/2000 | Maxim et al. | ............. | 257/797 |
| 6,090,703 A * | 7/2000 | Bandyopadhyay et al. | .. | 438/637 |
| 6,093,631 A * | 7/2000 | Jaso et al. | ............. | 438/618 |
| 6,100,177 A * | 8/2000 | Noguchi | ............. | 438/620 |
| 6,107,186 A * | 8/2000 | Erb | ............. | 438/633 |
| 6,214,745 B1 * | 4/2001 | Yang et al. | ............. | 438/759 |
| 6,221,759 B1 * | 4/2001 | Bothra et al. | ............. | 438/627 |
| 6,309,956 B1 * | 10/2001 | Chiang et al. | ............. | 438/622 |
| 6,323,118 B1 * | 11/2001 | Shih et al. | ............. | 438/624 |
| 6,329,284 B2 * | 12/2001 | Maekawa | ............. | 438/637 |
| 6,399,897 B1 * | 6/2002 | Umematsu et al. | ............. | 174/261 |
| 6,413,863 B1 * | 7/2002 | Liu et al. | ............. | 438/687 |
| 6,424,042 B1 * | 7/2002 | Kitani | ............. | 257/752 |
| 6,436,807 B1 * | 8/2002 | Cwynar et al. | ............. | 438/619 |
| 6,500,712 B1 * | 12/2002 | Wu | ............. | 438/257 |

(Continued)

*Primary Examiner* — Caleb Henry
(74) *Attorney, Agent, or Firm* — Winston Hsu; Scott Margo

(57) ABSTRACT

A method for manufacturing a damascene structure includes providing a substrate having a dielectric layer formed thereon, forming at least a trench in the dielectric layer, forming at least a via hole and a dummy via hole in the dielectric layer, forming a first conductive layer filling up the trench, the via hole and the dummy via hole on the substrate, and performing a chemical mechanical polishing process to form a damascene structure and simultaneously to remove the dummy via hole.

19 Claims, 10 Drawing Sheets

(56) References Cited

U.S. PATENT DOCUMENTS

| | | | |
|---|---|---|---|
| 6,767,826 B2* | 7/2004 | Abe | 438/638 |
| 6,790,761 B2* | 9/2004 | Sakata | 438/619 |
| 6,849,549 B1* | 2/2005 | Chiou et al. | 438/692 |
| 6,955,987 B2* | 10/2005 | Wu | 438/692 |
| 6,989,603 B2* | 1/2006 | Zhang | 257/774 |
| 7,153,787 B2* | 12/2006 | Cho et al. | 438/789 |
| 7,166,531 B1* | 1/2007 | van den Hoek et al. | 438/623 |
| 7,179,734 B2* | 2/2007 | Keum | 438/623 |
| 7,208,408 B2* | 4/2007 | Yuasa et al. | 438/638 |
| 7,259,092 B2* | 8/2007 | Jung | 438/637 |
| 7,470,630 B1* | 12/2008 | Chen et al. | 438/733 |
| 7,470,981 B2* | 12/2008 | Egusa | 257/700 |
| 7,560,377 B2* | 7/2009 | Cheung et al. | 438/623 |
| 7,605,085 B2* | 10/2009 | Tomita et al. | 438/700 |
| 7,651,725 B2* | 1/2010 | Yau et al. | 427/97.7 |
| 7,781,335 B2* | 8/2010 | Isono | 438/643 |
| 7,802,224 B2* | 9/2010 | Mori et al. | 716/55 |
| 7,951,704 B2* | 5/2011 | Fang et al. | 438/622 |
| 7,960,821 B2 | 6/2011 | Chen et al. | |
| 7,964,969 B2* | 6/2011 | Harada | 257/758 |
| 7,972,976 B1* | 7/2011 | van den Hoek et al. | 438/781 |
| 8,039,293 B2* | 10/2011 | Kawano | 438/98 |
| 8,334,167 B2* | 12/2012 | Kawano | 438/98 |
| 8,418,114 B2* | 4/2013 | Mori et al. | 716/130 |
| 8,614,146 B2* | 12/2013 | Takesako et al. | 438/672 |
| 2003/0203619 A1* | 10/2003 | Abe | 438/637 |
| 2004/0087140 A1* | 5/2004 | Kordic et al. | 438/645 |
| 2004/0227241 A1* | 11/2004 | Enomoto | 257/751 |
| 2005/0032253 A1* | 2/2005 | Hsu et al. | 438/17 |
| 2005/0121792 A1* | 6/2005 | Harada | 257/758 |
| 2005/0221600 A1* | 10/2005 | Daamen et al. | 438/622 |
| 2005/0233564 A1* | 10/2005 | Kitada et al. | 438/597 |
| 2006/0065981 A1* | 3/2006 | Egusa | 257/774 |
| 2006/0094245 A1* | 5/2006 | Seo | 438/700 |
| 2006/0163730 A1* | 7/2006 | Matsumoto et al. | 257/751 |
| 2007/0069387 A1* | 3/2007 | Kyeun | 257/760 |
| 2007/0108618 A1* | 5/2007 | Hasunuma et al. | 257/758 |
| 2008/0057701 A1* | 3/2008 | Engbrecht et al. | 438/624 |
| 2009/0032491 A1* | 2/2009 | Basker et al. | 216/13 |
| 2010/0007021 A1* | 1/2010 | Choo et al. | 257/751 |
| 2010/0065915 A1* | 3/2010 | Chuang et al. | 257/369 |
| 2010/0123212 A1* | 5/2010 | Chung et al. | 257/529 |
| 2010/0155963 A1* | 6/2010 | Chen et al. | 257/774 |
| 2010/0291729 A1* | 11/2010 | Kawano | 438/73 |
| 2012/0001344 A1* | 1/2012 | Takesako et al. | 257/774 |
| 2013/0119543 A1* | 5/2013 | Yu et al. | 257/741 |
| 2013/0224949 A1* | 8/2013 | Fang et al. | 438/653 |

* cited by examiner

METHOD FOR MANUFACTURING DAMASCENE STRUCTURE INVOLVING DUMMY VIA HOLES

BACKGROUND OF THE INVENTION

1. Field of the Invention

The present invention relates generally to a method for manufacturing a damascene structure, and more particularly, to a method for manufacturing a damascene structure capable of improving chemical mechanical polishing (hereinafter abbreviated as CMP) result.

2. Description of the Prior Art

In the fabrication of semiconductor integrated circuits (ICs), semiconductor devices are generally connected by several metallic interconnecting layers commonly referred to as multi-level interconnects, and damascene process has been deemed a convenient and predominant method for forming the multi-level interconnects. Principally, the damascene process includes etching a dielectric material layer to form trench and/or via patterns, filling the patterns with conductive materials such as copper, and performing a planarization process. Thus a metal interconnect is obtained.

Those skilled in the art have well known that the topography and pattern densities of the surface being polished influence the CMP result greatly. For example, when a surface being polished includes patterns having different pattern densities, the planarization rates of the CMP are different based upon respective pattern densities, and thus evenness of the planarized surface is inferior, and even suffers dishing problem.

Since the CMP process is one accepted method of planarization and now typically employed in the industry, it is always in need to solve the inferior evenness and dishing problem that are caused by different pattern densities.

SUMMARY OF THE INVENTION

According to a first aspect of the present invention, there is provided a method for manufacturing a damascene structure. The method includes providing a substrate having a dielectric layer formed thereon; forming at least a trench, at least a via hole, and at least a dummy via hole in the dielectric layer; forming a first conductive layer filling the trench, the via hole, and the dummy via hole on the substrate; and performing a chemical mechanical polishing (CMP) process to form the damascene structure and simultaneously remove the dummy via hole.

According to the methods for manufacturing a damascene structure provided by the present invention, the dummy via holes are formed in the substrate in order to average the pattern densities on the surface of the substrate and thus to improve CMP result and to avoid dishing problem. Consequently, a substrate having a surface of superior evenness is obtained. After forming the dual damascene structure by performing the CMP process, the dummy via holes are completely removed, and thus no impact is rendered to the subsequent processes. More important, the dummy via holes can be positioned in a dummy-blocking region where no dummy elements are allowed for improving the CMP process and subsequently be removed by the CMP process according to the present invention. Therefore the final products still satisfy with the requirement that no dummy elements are allowed in the dummy-blocking region. In other words, the method for manufacturing the damascene structure provided by the present invention is able to improve the CMP result and obtains a surface of superior evenness without rendering any adverse impact to the final products.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-5 are schematic drawings illustrating a method for manufacturing a damascene structure provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

FIGS. 6-10 are schematic drawings illustrating a method for manufacturing a damascene structure provided by a second preferred embodiment of the present invention, wherein FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, and FIG. 10 is a schematic drawing in a step subsequent to FIG. 9.

DETAILED DESCRIPTION

Figure 1:
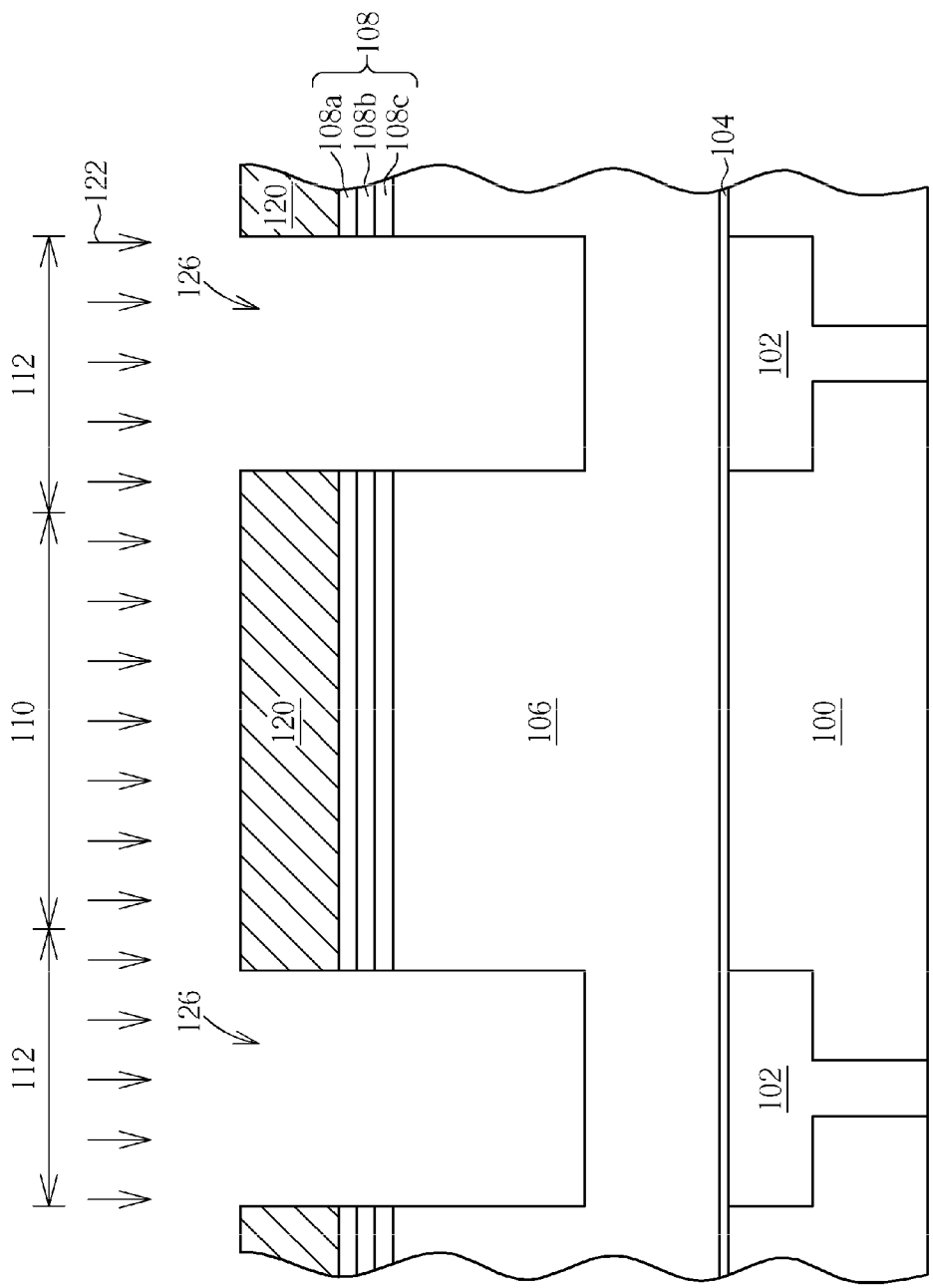

Please refer to FIGS. 1-5, which are schematic drawings illustrating a method for manufacturing a damascene structure provided by a first preferred embodiment of the present invention. As shown in FIG. 1, the preferred embodiment first provides a substrate 100, for example but not limited to a silicon substrate, a silicon-containing substrate, or a silicon-on-insulator (SOI) substrate. It is noteworthy that the substrate 100 includes at least a dummy-blocking region 110 and element regions 112 defined thereon according to the preferred embodiment. The dummy-blocking region 110 is a particularly defined region where dummy elements are not allowed to exist within a product such as micro electro mechanical systems (MEMS). The substrate 100 further includes a conductive layer 102 formed therein, and a base layer 104 covering the conductive layer 102 formed thereon. In the preferred embodiment, the conductive layer 102 includes conductive elements such as a wire, a doped region, or a gate electrode, and the base layer 104 exemplarily includes dielectric material such as nitrogen-doped silicon carbide (NDC). In addition, the substrate 100 further includes an inter-metal dielectric (hereinafter abbreviated as IMD) layer or an inter-layer dielectric (ILD) layer (not shown). As shown in FIG. 1, the IMD layer 106 covers the base layer 104. The IMD layer 106 can include low dielectric constant (K) (i.e. K value lower than 3.9) material, ultra low-k (ULK) (i.e. K value lower than 2.6) material, or porous ULK material. It is well-known that the low-K material, the ULK material and the porous ULK material are not dense materials and have weak structure strength, therefore, a dense multiple layer 108 is exemplarily formed on the IMD layer 106 in the preferred embodiment. The multiple layer 108 includes at least a metal hard mask 108a. In addition, the multiple layer 108 preferably further includes a silicon oxynitride (SiON) layer 108b and a silicon oxide (SiO) layer 108c as shown in FIG. 1. The metal hard mask 108a can be a single-layered structure or a multi-layered structured. The metal hard mask 108a includes materials selected from the group consisting of titanium (Ti), titanium nitride (TiN), tantalum (Ta), and tantalum nitride (TaN). For example, the metal hard mask 108a provided by the preferred embodiment can include a multiple layer including Ti/TiN or Ta/TaN. Furthermore, it is noteworthy that because a stress of the metal hard mask 108a is usually opposite to a stress of the IMD layer 106, the SiO layer 108c of the multiple layer 108 provided by the preferred embodiment further serves as a buffer between the metal hard mask 108a and the IMD layer 106. Therefore the IMD layer 106 is protected from being directly impacted by the opposite stress from the metal hard mask 108a. Additionally, an anti-reflective coating (ARC) layer (not shown) is formed on the metal hard mask 108a according to the preferred embodiment. The ARC can include SiON or TEOS, but not limited to this.

Please still refer to FIG. 1. Next, a patterned photoresist 120 is formed on the multiple layer 108. The patterned photoresist 120 includes a plurality of openings for defining trench patterns of damascene structures. After forming the patterned photoresist 120, an etching process 122 is performed to etch the multiple layer 108 and a portion of the IMD layer 106 through the patterned photoresist 120 with the patterned photoresist 120 serving as an etching mask. Consequently, trenches 126 are formed in an upper portion of the IMD layer 106.

Figure 2:
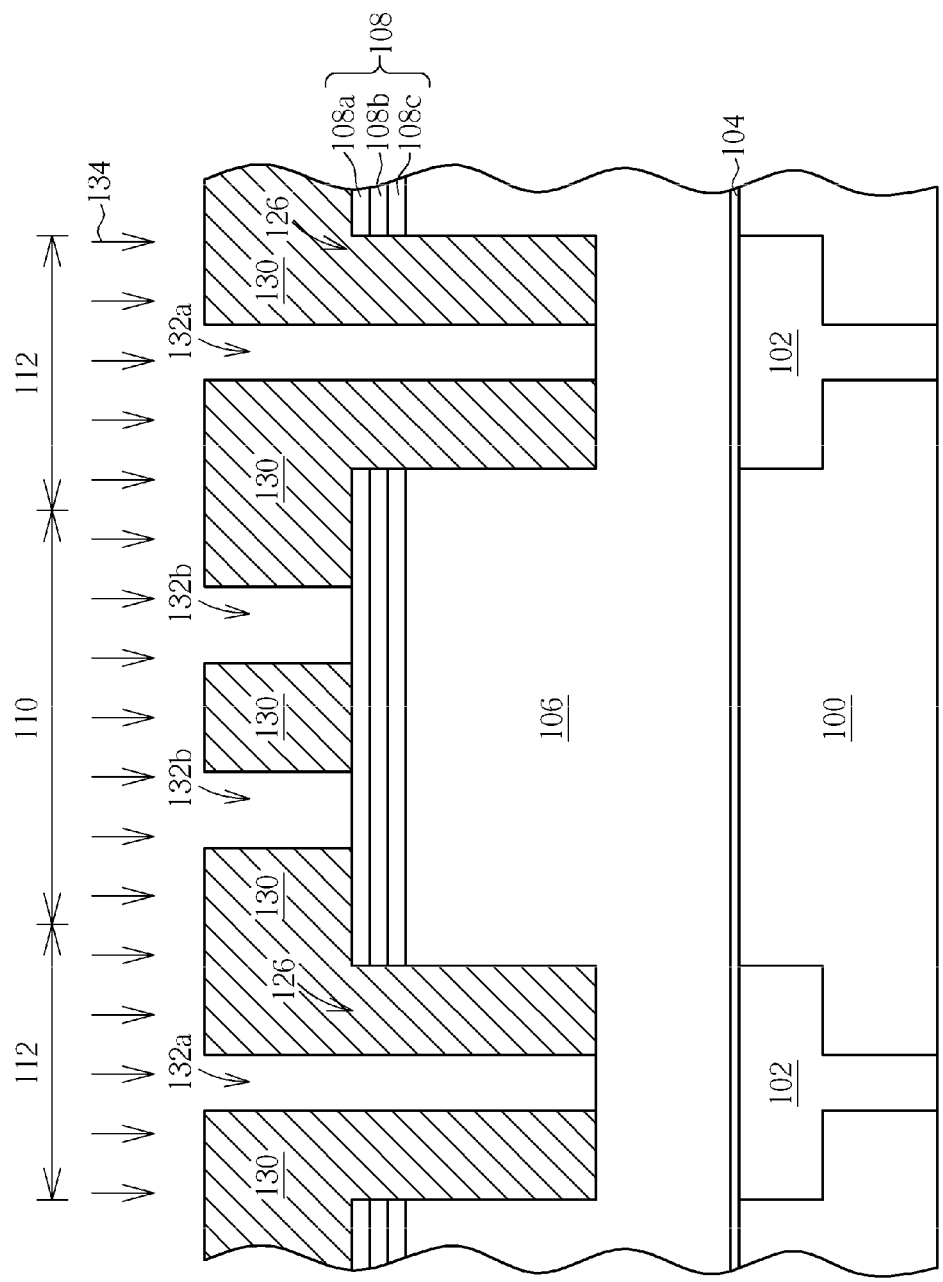

Please refer to FIG. 2. After forming the trenches 126, the patterned photoresist 120 is removed by performing an $O_2$ plasma treatment. Subsequently, another patterned photoresist 130 is formed on the substrate 100. The patterned photoresist 130 include a plurality of openings 132a and 132b. The openings 132a are used to define via patterns of the damascene structures in the element regions 112, particularly in the trenches 126. It is noteworthy that the preferred embodiment provides the openings 132b to define a plurality of dummy via holes in the dummy-blocking region 110. After forming the patterned photoresist 130, an etching process 134 is performed to etch the multiple layer 108 and a portion of the IMD layer 106 in the dummy-blocking region 110 and the IMD layer 106 under bottoms of the trenches 126 through the openings 132a and 132b with the patterned photoresist 130 serving as an etching mask.

Figure 3:
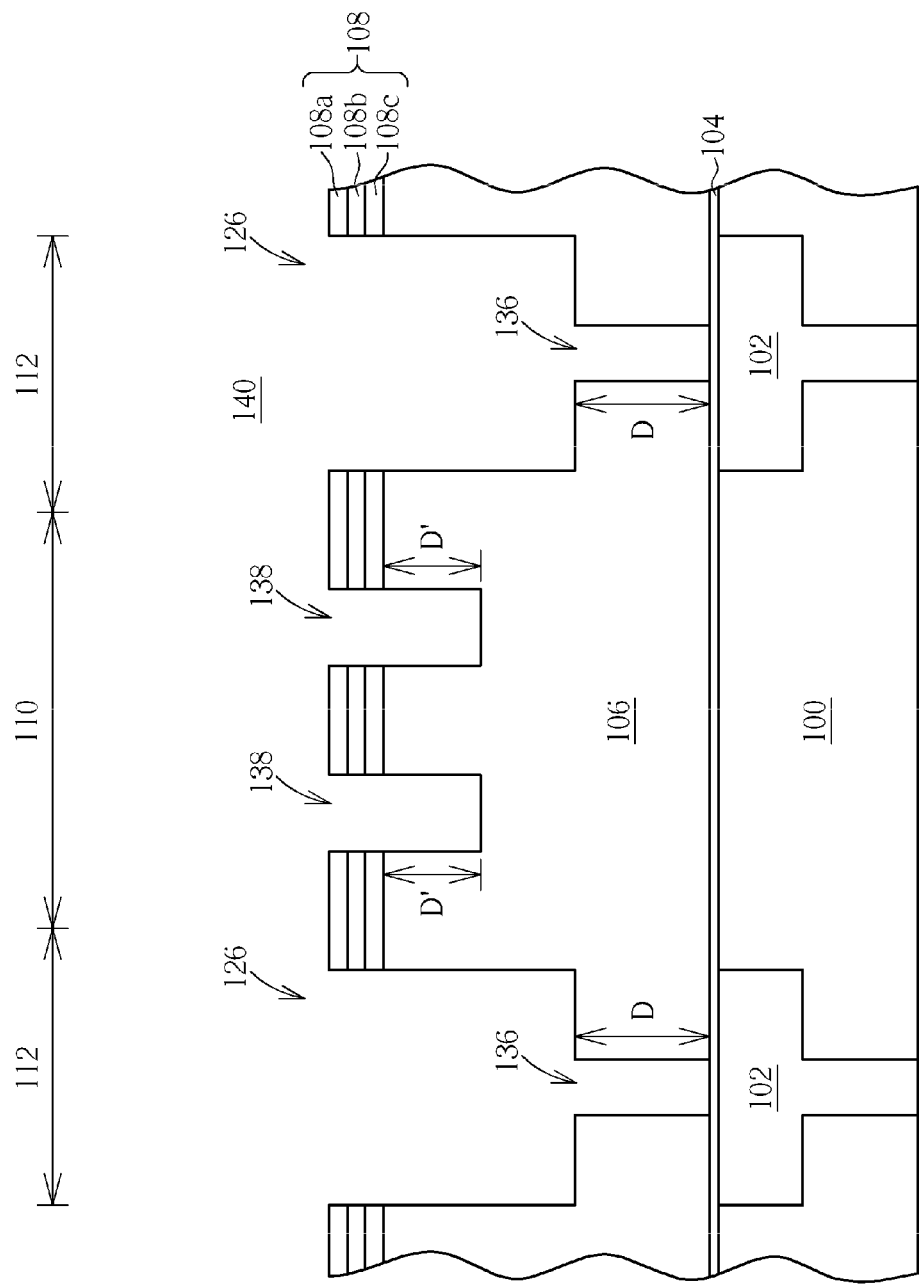

Please refer to FIG. 3. After performing etching process 134, a via hole 136 is formed in the IMD layer 106 under the bottoms of each trench 126 and thus to expose the base layer 104. Simultaneously, dummy via holes 138 are formed in an upper portion of the IMD layer 106 in the dummy-blocking region 110. Then, the patterned photoresist 130 is removed by an $O_2$ plasma treatment. It is noteworthy that the via hole 136 in the bottom of the trench 126 includes a depth D and the dummy via hole 138 in the dummy-blocking region 110 include a depth D'. Since the via holes 136 are obtained by directing etching the IMD layer 106 while the dummy via holes 138 are obtained by sequentially etching the multiple layer 108 and the IMD layer 106, the depth D' of the dummy via holes 138 is smaller than the depth D of the via holes 136. Furthermore, the dummy via holes 138 and the via holes 136 are non-coplanar as shown in FIG. 3.

Figure 4:
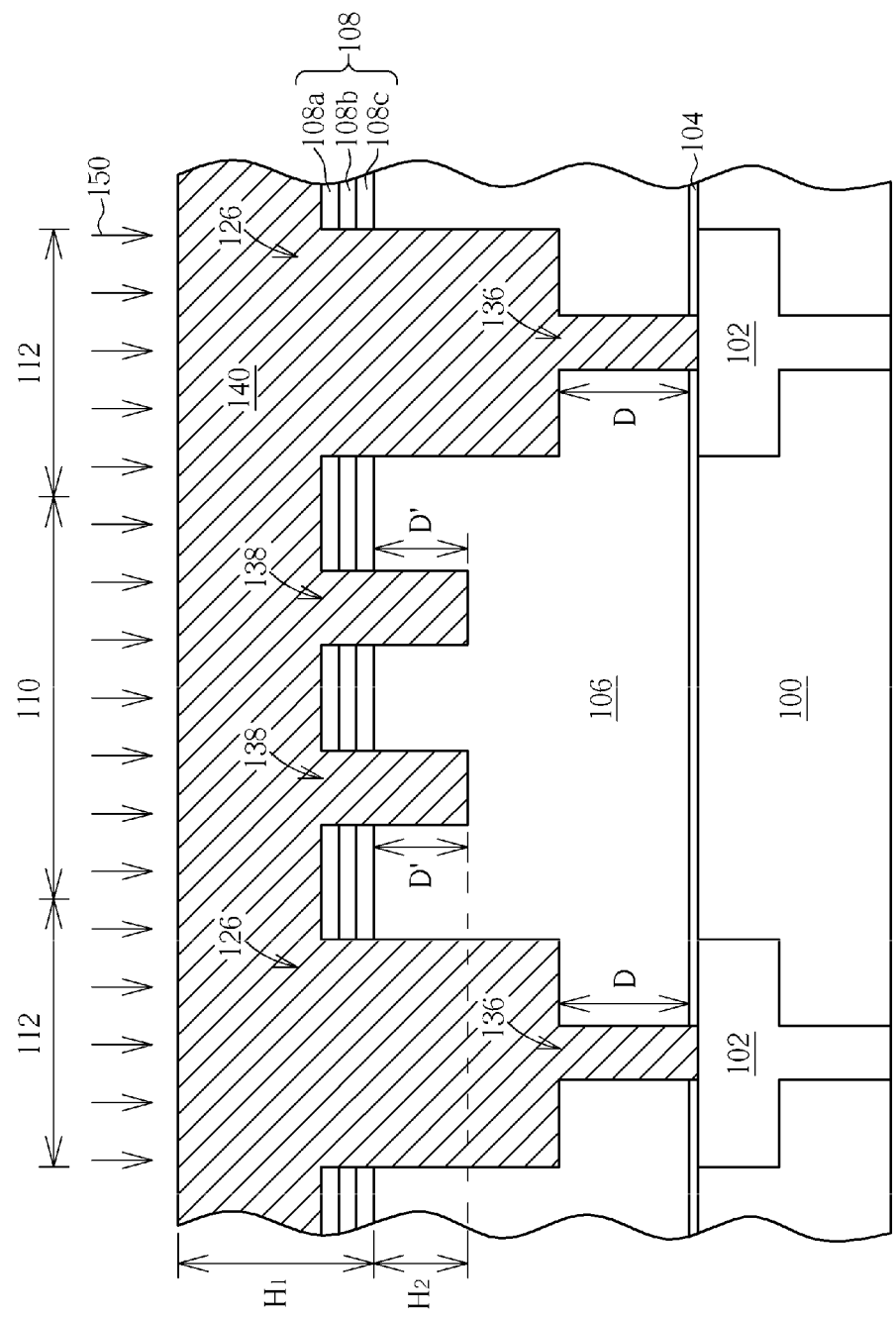

Please refer to FIG. 4. After forming the trenches 126 and the via holes 136, a proper etching process is performed to remove the base layer 104 from bottoms of the via holes 136. Consequently, the conductive layer 102 is exposed in the bottoms of the via hole 136. Then, a barrier layer (not shown) and a conductive layer 140 are sequentially formed in the trenches 126, the via holes 136, and the dummy via holes 138. As shown in FIG. 4, the conductive layer 140 fills up the trenches 126, the via holes 136, and the dummy via holes 138.

Figure 5:
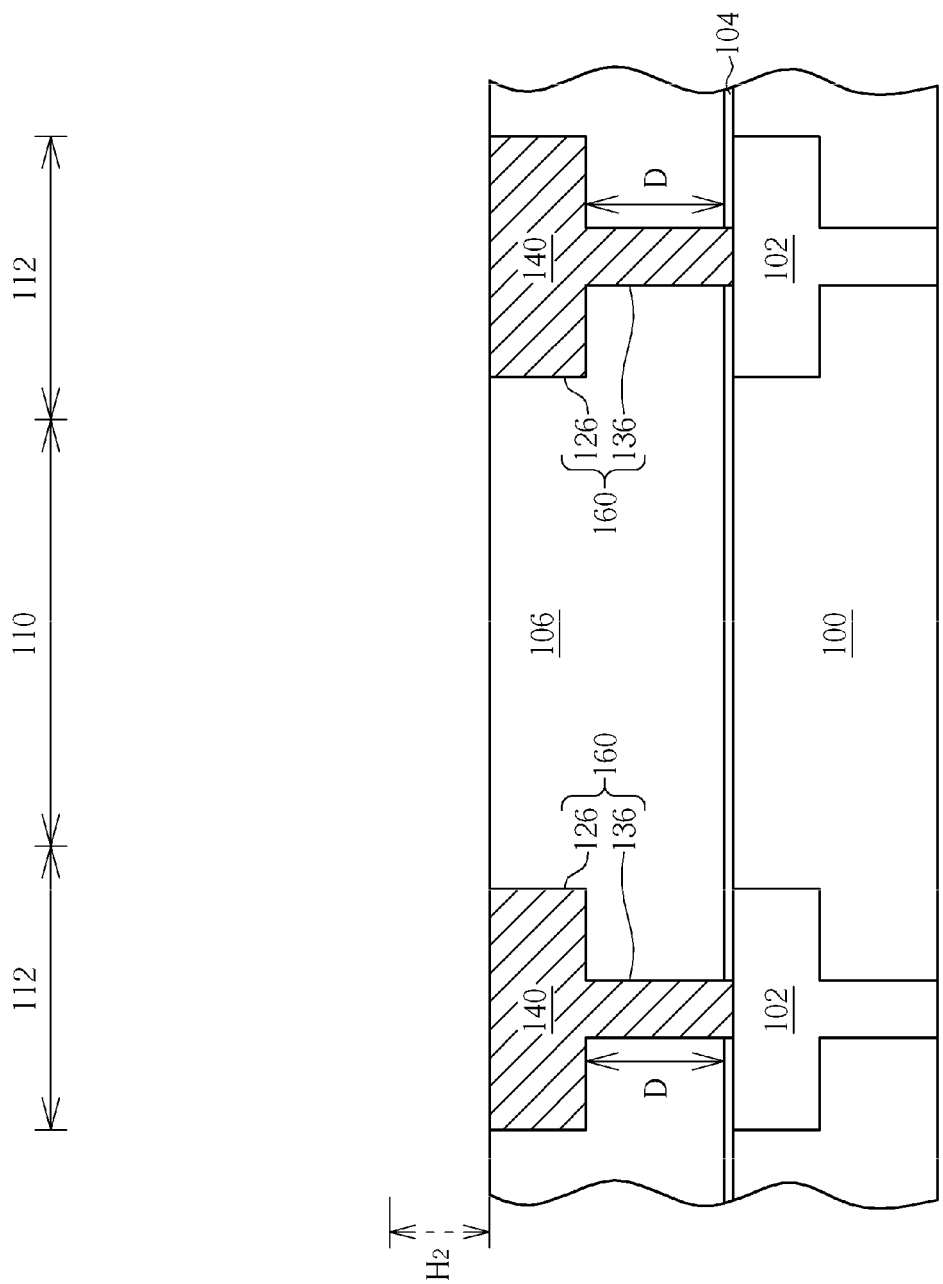

Please refer to FIG. 4 and FIG. 5. After forming the conductive layer 140, a CMP process 150 is performed to remove extra and unnecessary conductive layer 140 from the substrate 100 and subsequently to remove both the conductive layer 140 and the multiple layer 108. As shown in FIG. 5, the conductive layer 140 and the multiple layer 108 being removed include a polished height $H_1$. It is noteworthy that after removing the multiple layer 108 and exposing the IMD layer 106, the preferred embodiment further uses the CMP process 150 to remove a portion of the conductive layer 140 and a portion of the IMD layer 106 until the dummy via holes 138 are completely removed from the dummy-blocking region 110. As shown in FIG. 5, the conductive layer 140 and the IMD layer 106 being removed include a buffer height $H_2$, and the buffer height $H_2$ is larger than the depth D' of the dummy via holes 138 in order to ensure that the dummy via holes 138 are completely removed. Simultaneously with removing the dummy via holes 138, damascene structures 160 are formed in the element regions 112 according to the preferred embodiment.

According to the method for manufacturing a damascene structure provided by the preferred embodiment, which adopts the trench first process, the dummy via holes 138 are formed in the dummy-blocking region 110 simultaneously with forming the via holes 136, and the dummy via holes 138 are provided to average the pattern densities. Consequently, the CMP process 150 result is improved and the dishing problem, particularly often occurs in the dummy-blocking region 110, is solved. And thus a substrate having a superior surface evenness is obtained.

Figure 6:
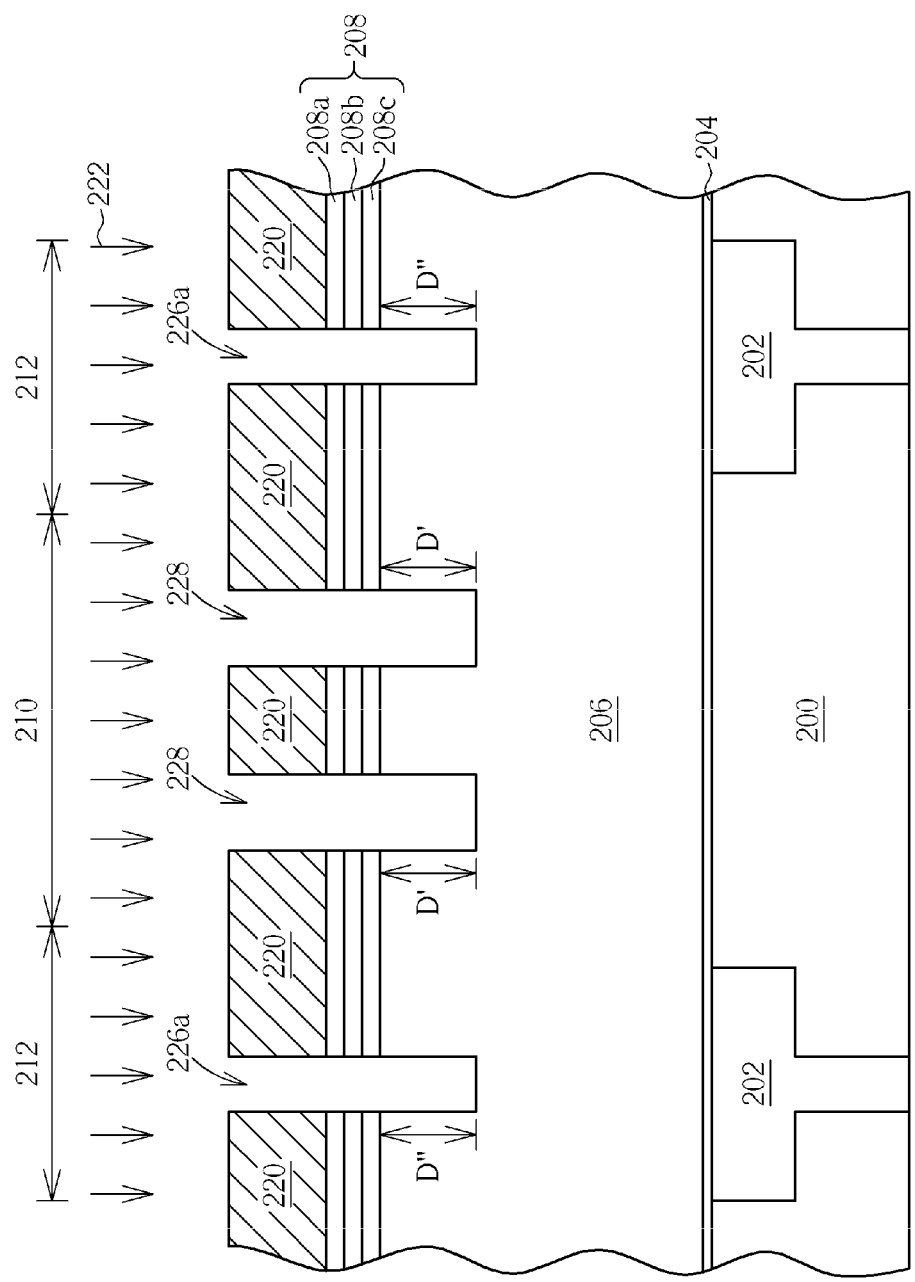

Please refer to FIGS. 6-10, which are schematic drawings illustrating a method for manufacturing a damascene structure provided by a second preferred embodiment of the present invention. Please note that elements the same in both first and second preferred embodiments can include the same material choice, therefore those details are omitted herein in the interest of brevity. As shown in FIG. 6, the preferred embodiment first provides a substrate 200, and the substrate 200 includes a dummy-blocking region 210 and element regions 212 defined thereon. The substrate 200 further includes a conductive layer 202 formed therein, and a base layer 104 and an IMD layer 206 are sequentially formed thereon. A multiple layer 208 is exemplarily formed on the IMD layer 206 in the preferred embodiment. The multiple layer 208 includes at least a metal hard mask 208a. In addition, the multiple layer 208 preferably further includes a SiON layer 208b and a SiO layer 208c as shown in FIG. 6. Because a stress of the metal hard mask 208a is usually opposite to a stress of the IMD layer 206, the SiO layer 208c of the multiple layer 208 provided by the preferred embodiment further serves as a buffer between the metal hard mask 208a and the IMD layer 206. Therefore the IMD layer 206 is protected from being directly impacted by the opposite stress from the metal hard mask 208a. Additionally, an ARC layer (not shown) can be formed on the metal hard mask 108a according to the preferred embodiment.

Please still refer to FIG. 6. Next, a patterned photoresist 220 including a plurality of openings is formed on the multiple layer 208. It is noteworthy that the openings in the element regions 212 are used to define via patterns of damascene structures while the openings in the dummy-blocking region 210 are used to define a plurality of dummy via holes. After forming the patterned photoresist 220, and etching process 222 is performed to etch the multiple layer 208 and a portion of the IMD layer 206 through the patterned photoresist 220 with the patterned photoresist 220 serving as an etching mask. Consequently, via openings 226a are formed in an upper portion of the IMD layer 206 in the element regions 212 and a plurality of dummy via holes 228 are formed in an upper portion of the IMD layer 206 in the dummy-blocking region 210, simultaneously. The via openings 226a include a depth D" and the dummy via holes 228 in the dummy-blocking region 210 include a depth D'. The depth D' of the dummy via holes 228 is equal to the depth D" of the via openings 226a. Furthermore, the dummy via holes 228 and the via openings 226a are coplanar as shown in FIG. 6.

Figure 7:
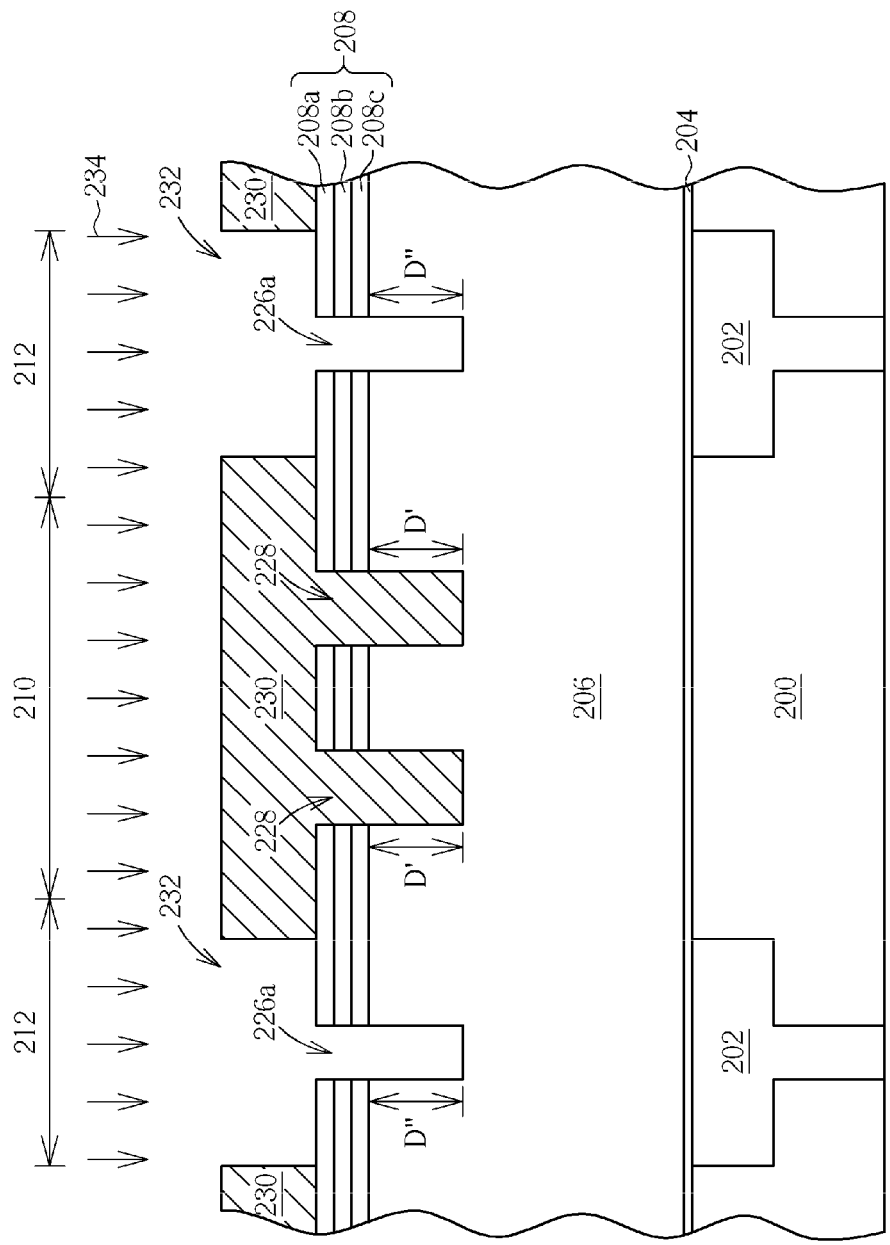

Please refer to FIG. 7. After forming the via openings 226a and the dummy via holes 228, the patterned photoresist 220 is removed by an $O_2$ plasma treatment. Subsequently, another patterned photoresist 230 is formed on the substrate 200. The patterned photoresist 230 include a plurality of openings 232, and the openings 232a are used to define trench patterns of the damascene structures in the element regions 212. It is noteworthy that the patterned photoresist 230 in the dummy-blocking region 210 fills up the dummy via holes 228. After forming the patterned photoresist 230, an etching process 234 is performed to etch the multiple layer 208 and a portion of the IMD layer 206 exposed in the via openings 226a through the openings 232 with the patterned photoresist 230 serving as an etching mask.

Figure 8:
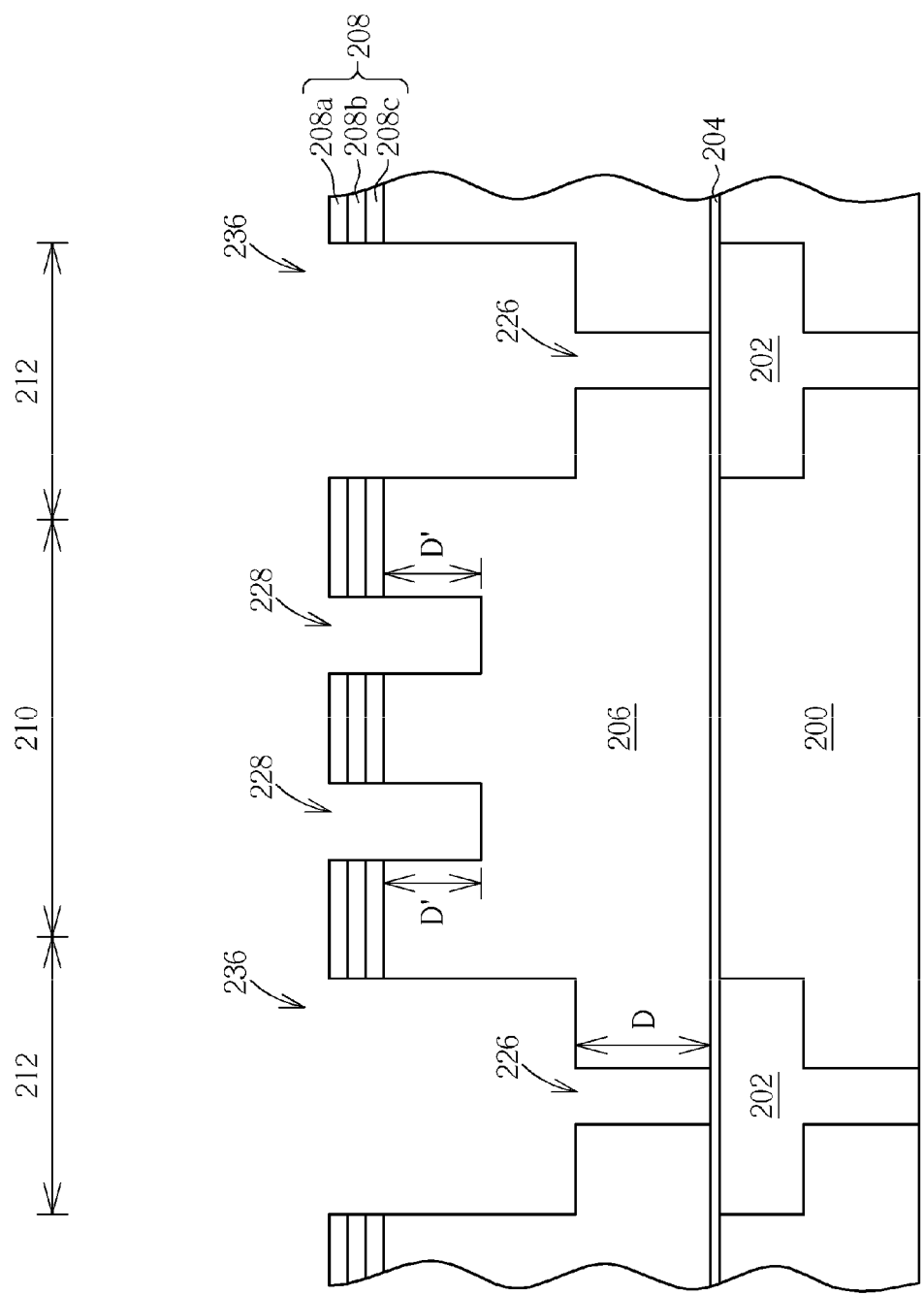

Please refer to FIG. 7 and FIG. 8. After the etching process 234, trenches 236 are formed in the IMD layer 206 in the element regions 212 as shown in FIG. 8. Furthermore, the via openings 226a are transferred into a lower portion of the IMD layer 206 to form via holes 226 in the IMD layer 206 under bottoms of each trench 236. It is noteworthy that during the etching process 234, the dummy via holes 228 are protected by the patterned photoresist 230 and thus remain impervious to the etching process 234. Then, the patterned photoresist 230 is removed by an $O_2$ plasma treatment. As shown in FIG. 8, the via holes 226 in the bottom of the trench 226 include a depth D and the dummy via holes 238 in the dummy-blocking region 210 include a depth D'. The depth D' of the dummy via holes 228 is equal to smaller than the depth D of the via holes 226. Furthermore, the dummy via holes 228 and the via holes 226 are non-coplanar as shown in FIG. 8.

Figure 9:
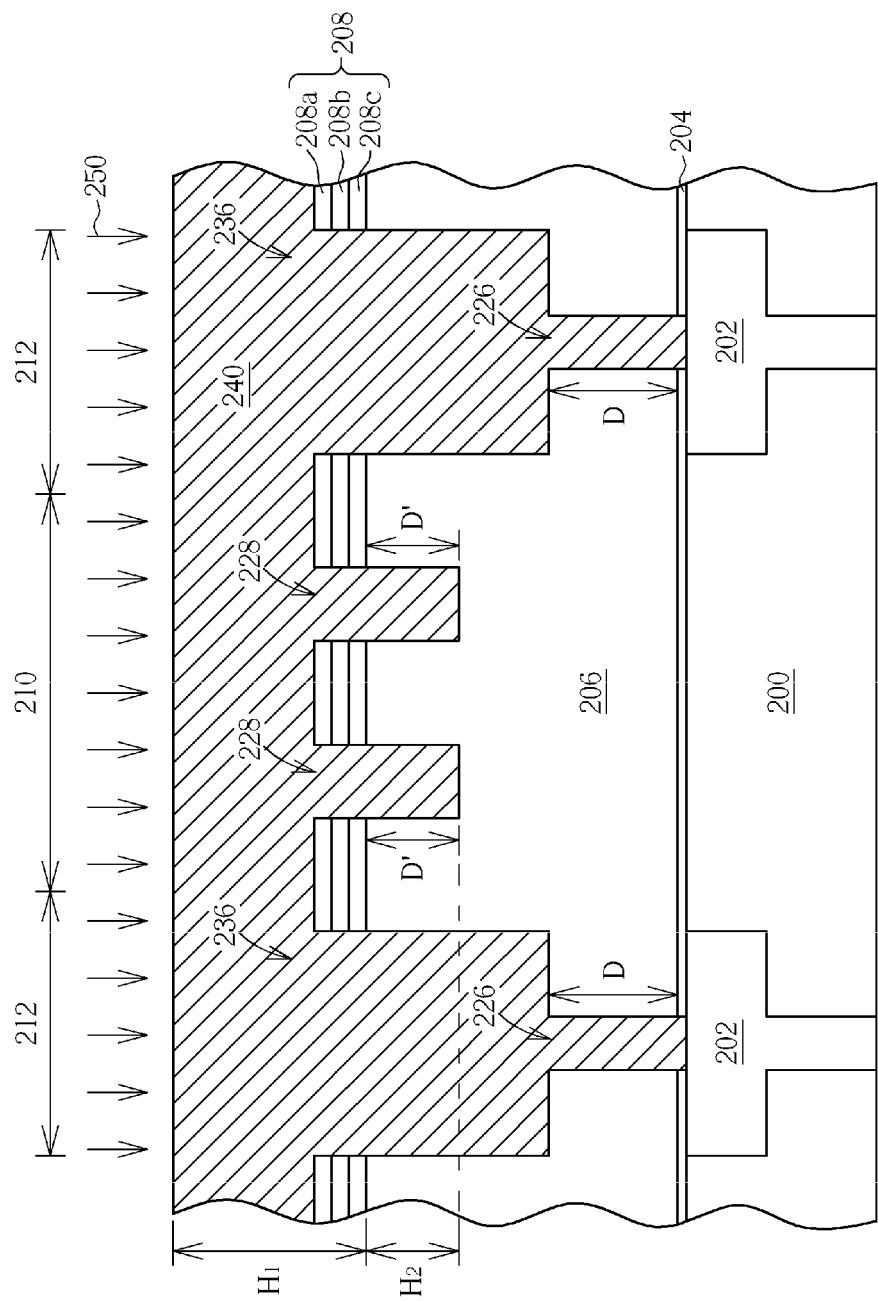

Please refer to FIG. 9. After forming the trenches 236 and the via holes 226, a proper etching process is performed to remove the base layer 204 from bottoms of the via holes 226. Consequently, the conductive layer 202 is exposed in the bottoms of the via holes 226. Then, a barrier layer (not shown) and a conductive layer 240 are sequentially formed in the trenches 236, the via holes 226, and the dummy via holes 228. As shown in FIG. 9, the conductive layer 240 fills up the trenches 236, the via holes 226, and the dummy via holes 228.

Figure 10:
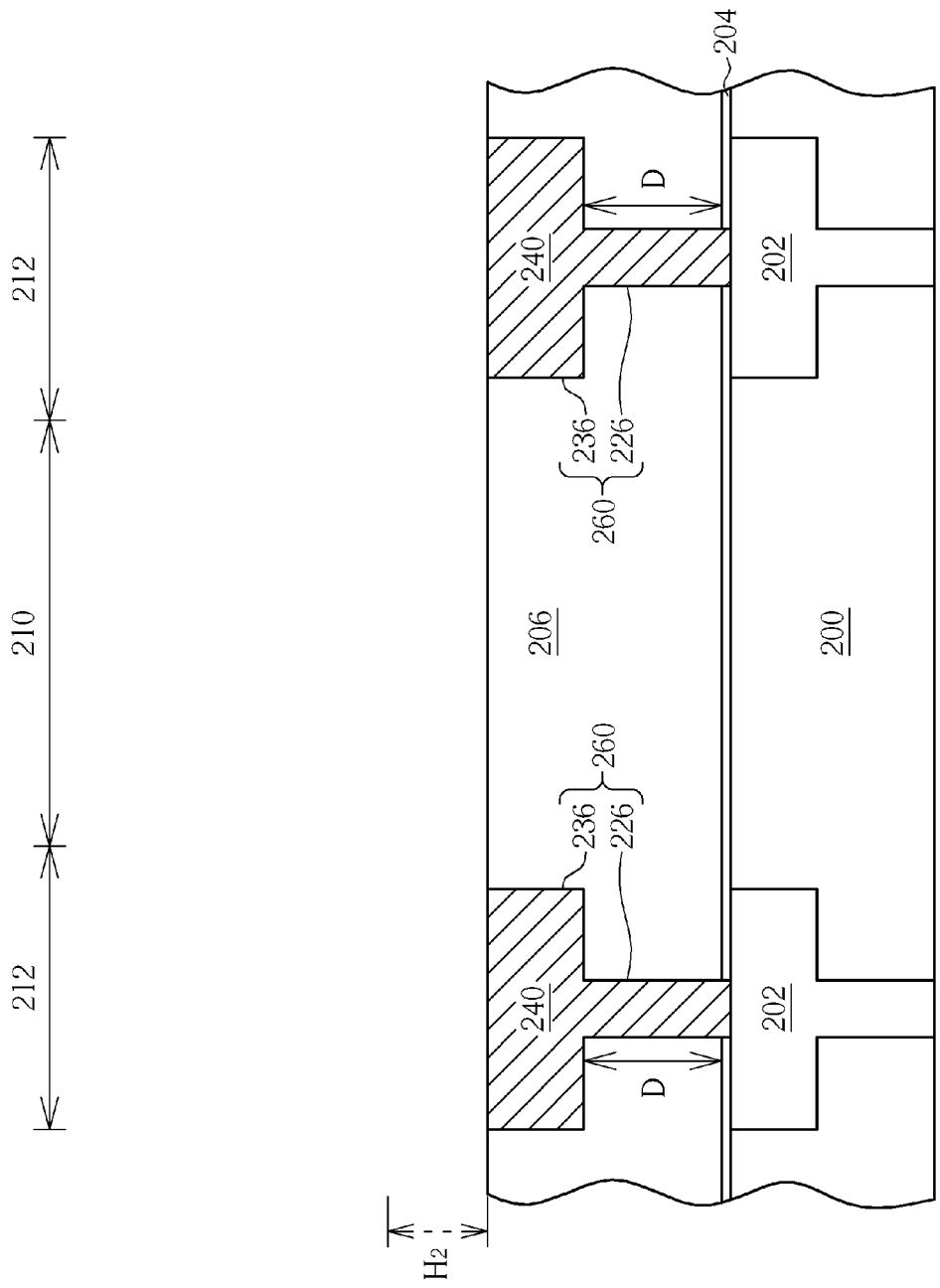

Please refer to FIG. 9 and FIG. 10. After forming the conductive layer 240, a CMP process 250 is performed to remove extra and unnecessary conductive layer 240 from the substrate 200 and subsequently to remove both the conductive layer 240 and the multiple layer 208. As shown in FIG. 10, the conductive layer 240 and the multiple layer 208 being removed include a polished height $H_1$. It is noteworthy that after removing the multiple layer 208 and exposing the IMD layer 206, the preferred embodiment further uses the CMP process 250 to remove a portion of the conductive layer 240 and a portion of the IMD layer 206 until the dummy via holes 228 are completely removed from the dummy-blocking region 210. As shown in FIG. 10, the conductive layer 240 and the IMD layer 206 being removed include a buffer height $H_2$, and the buffer height $H_2$ is larger than the depth D' of the dummy via holes 228 in order to ensure that the dummy via holes 228 are completely removed. Simultaneously with removing the dummy via holes 228, damascene structures 260 are formed in the element regions 212 according to the preferred embodiment.

According to the method for manufacturing a damascene structure provided by the preferred embodiment, which adopts the partial-via first process, the dummy via holes 228 are formed in the dummy-blocking region 210 simultaneously with forming the via openings 226a, and the dummy via holes 228 are provided to average the pattern densities. Consequently, the CMP process 250 result is improved and the dishing problem, particularly often occurs in the dummy-blocking region 210, is solved. And thus a substrate having superior surface evenness is obtained.

It should be noted that though the present invention discloses only the trench first process and the via first process, those skilled in the art would easily realize that the method for manufacturing a damascene structure provided by the present application can adopt via-first process and self-aligned process for improving the CMP process result.

According to the methods for manufacturing a damascene structure provided by the present invention, the dummy via holes are formed in the substrate in order to average the pattern densities on the surface of the substrate and thus to improve CMP result and to avoid dishing problem. Consequently, a substrate having a surface of superior evenness is obtained. After forming the dual damascene structures by performing the CMP process, the dummy via holes are completely removed, and thus no impact is rendered to the subsequent processes. More important, the dummy via holes can be positioned in the dummy-blocking region where no dummy elements are allowed, such as the dummy-blocking region of micro electro mechanical systems (MEMS), for improving the CMP process and subsequently removed by the CMP process according to the present invention. Therefore the final products still satisfy with the requirement that no dummy elements are allowed in the dummy-blocking region. In other words, the method for manufacturing the damascene structure provided by the present invention is able to improve the CMP result and obtains a surface of superior evenness without rendering any impact to the final products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a damascene structure comprising steps of:
   providing a substrate having a dielectric layer formed thereon;
   forming at least a trench in the dielectric layer;
   simultaneously forming at least a via hole and at least a dummy via hole in the dielectric layer, wherein a depth of the dummy via hole is smaller than a depth of the via hole;
   forming a first conductive layer filling the trench, the via hole, and the dummy via hole on the substrate; and
   performing a chemical mechanical polishing (CMP) process to form the damascene structure and simultaneously remove the dummy via hole.

2. The method for manufacturing the damascene structure according to claim 1, wherein the substrate further comprises a second conductive layer formed therein.

3. The method for manufacturing the damascene structure according to claim 2, wherein the second conductive layer is exposed in a bottom of the via hole.

4. The method for manufacturing the damascene structure according to claim 1, wherein the via hole and the dummy via hole are formed after forming the trench.

5. The method for manufacturing the damascene structure according to claim 4, wherein the step of forming the trench further comprises:
- forming a first patterned photoresist for defining the trench on the substrate; and
- performing a first etching process to form the trench in the dielectric layer.

6. The method for manufacturing the damascene structure according to claim 5, wherein the step of forming the via hole and the dummy via hole further comprising:
- forming a second patterned photoresist for defining the via hole and the dummy via hole on the substrate; and
- performing a second etching process to form the via hole in the dielectric layer in a bottom of the trench and simultaneously forming the dummy via hole in the dielectric layer.

7. The method for manufacturing the damascene structure according to claim 4, further comprising a step of forming a multiple layer on the dielectric layer before forming the trench.

8. The method for manufacturing the damascene structure according to claim 7, wherein the multiple layer comprises at least a metal hard mask.

9. The method for manufacturing the damascene structure according to claim 1, wherein the via hole and the dummy via hole are formed before forming the trench.

10. The method for manufacturing the damascene structure according to claim 9, wherein the step of forming the via hole and the dummy via hole further comprises:
- forming a first patterned photoresist forming defining the via hole and the dummy via hole on the substrate; and
- performing a first etching process to form at least a via opening and the dummy via hole in the dielectric layer.

11. The method for manufacturing the damascene structure according to claim 10, wherein the via opening and the dummy via hole are coplanar.

12. The method for manufacturing the damascene structure according to claim 10, wherein the step of forming the trench further comprises:
- forming a second patterned photoresist for defining the trench on the substrate; and
- performing a second etching process to form the trench in the dielectric layer and simultaneously transfer the via opening into the dielectric layer under a bottom of the trench to form the via hole.

13. The method for manufacturing the damascene structure according to claim 12, wherein the second patterned photoresist filling up the dummy via hole.

14. The method for manufacturing the damascene structure according to claim 9, further comprising a step of forming a multiple layer on the dielectric layer before forming the via opening and the dummy via hole.

15. The method for manufacturing the damascene structure according to claim 14, wherein the multiple layer comprises at least a metal hard mask.

16. The method for manufacturing the damascene structure according to claim 1, wherein the via hole and the dummy via hole are non-coplanar.

17. The method for manufacturing the damascene structure according to claim 1, wherein the CMP process further removes a portion of the first conductive layer and a portion of the dielectric layer, and the first conductive layer and the dielectric layer being removed comprise a buffer height.

18. The method for manufacturing the damascene structure according to claim 17, wherein the buffer height is larger than the depth of the dummy via hole.

19. The method for manufacturing the damascene structure according to claim 1, wherein the substrate further comprises a dummy-blocking region defined thereon, and the dummy via hole is formed in the dummy-blocking region.

* * * * *